United States Patent
Martin et al.

(10) Patent No.: US 6,686,100 B2
(45) Date of Patent: Feb. 3, 2004

(54) OPTICAL PROXIMITY CORRECTION METHOD

(75) Inventors: Brian Martin, Devon (GB); Christine Wallace, Devon (GB)

(73) Assignee: Zarlink Semiconductor Limited (GB)

( * ) Notice: Subject to any disclaimer, the term of this patent is extended or adjusted under 35 U.S.C. 154(b) by 91 days.

(21) Appl. No.: 09/976,940

(22) Filed: Oct. 12, 2001

(65) Prior Publication Data

US 2002/0102474 A1 Aug. 1, 2002

(30) Foreign Application Priority Data

Oct. 13, 2000 (GB) .............................. 0025247

(51) Int. Cl.$^7$ .............................................. G03F 9/00
(52) U.S. Cl. .......................................................... 430/5
(58) Field of Search ...................... 430/5, 30; 716/19, 716/20, 21

(56) References Cited

U.S. PATENT DOCUMENTS

| | | | |
|---|---|---|---|
| 5,657,235 A | 8/1997 | Liebmann et al. | 364/474.24 |
| 5,862,058 A | 1/1999 | Samuels et al. | 364/491 |

Primary Examiner—S. Rosasco
(74) Attorney, Agent, or Firm—Thompson Hine LLP

(57) ABSTRACT

A method of carrying out optical proximity correction in the design of a reticle for exposing a photoresist of a wafer in photolithography using a lens having a focal plane, the method including generating a dense-isolated offset focus/exposure matrix, containing dense-isolated offset values, being the difference between values of linewidth for dense and isolated lines, as a function of focal plane position, for each of a plurality of different exposures, selecting from among the contours of the dense-isolated offset focus/exposure matrix for each different exposure, the flattest contour, and carrying out optical proximity correction on the basis that the exposure will be the exposure corresponding to said flattest contour.

10 Claims, 3 Drawing Sheets

OPTICAL PROXIMITY CORRECTION METHOD

This application claims priority to British Patent Application No. 0025247.8, filed Oct. 13, 2000.

The invention relates to an improved method of optical proximity correction, and products thereof.

BACKGROUND OF THE INVENTION

As the resolution limit of an optical lithography tool is approached, the fidelity of printed features is compromised by the size and location of their neighbours resulting in reduced dimensional control. These "optical proximity" effects include dense-isolated bias, ie, effects resulting from changing linewidth density.

In photolithography lines are defined by passing light through a "reticle" which acts as a mask and is typically formed from glass printed with chrome patterns. In order to print lines the reticle is provided with lines and spaces which allow the light to pass through onto the photoresist (a photosensitive layer which covers the substrate which is to be etched using photolithography) and these lines can be of varying pitch. For repeating lines the pitch refers to the spacing of the lines, thus the greater the pitch the more isolated the lines. If the wavelength of the light approaches the size of the lines, their thickness (linewidth) can be affected. It is possible to correct for such variations in the printed linewidth on the wafer by changing the linewidths on the reticle. Such corrections are made automatically using optical proximity correction (OPC) software packages, of which there are now several commercially available brands, resulting in selective modification of the linewidths in the reticle design to achieve the desired printed image.

The applicant, Mitel Semiconductor Limited, has already developed a method of applying OPC through lithography simulation using the correction software CAPROX OPC (RTM) in conjunction with the optical lithography simulation tool SOLID-C (RTM), thereby allowing the entire procedure to be carried out without recourse to practical experiment or having restrictions imposed by the limitations of aerial image only correction (described in a paper by Arthur, G., Martin, B., Wallace, C. and Rosenbusch, A. entitled "Full-Chip Optical Proximity Correction using Lithography Simulation" presented at BACUS Photomask Symposium in September 1998.). A flow diagram for using CAPROX (RTM) is shown in FIG. 1.

OPC is normally applied at exposure-to-size for dense lines (ie, those having equal line/space ratio) and lines at other pitches are corrected using an appropriate linewidth versus pitch function. Alternatively the exposure-to-size for isolated lines could be used and lines at other pitches corrected. A description of OPC itself is given for example in Wallace, C., Duncan, C. and Martin, B. "Application of Optical Proximity Correction Manufacturing and its Effect on Process Control" Metrology, Inspection and Process Control for MicrolithographyXIV, SPIE, 2000.

SUMMARY OF THE INVENTION

According to the invention there is provided a method of optical proximity correction, and reticles and polysilicon gates produced by such a method, as set out in the accompanying claims.

The use of a selected exposure corresponding to a relatively flat contour of the dense-isolated offset focus/exposure matrix is desirable because it results in a manufacturing process having greater resilience to surface topography of the wafer.

BRIEF DESCRIPTION OF THE DRAWINGS

The invention will now be more particularly described, by way of example only, with reference to the accompanying drawings, in which.

DETAILED DESCRIPTION

Figure 1:
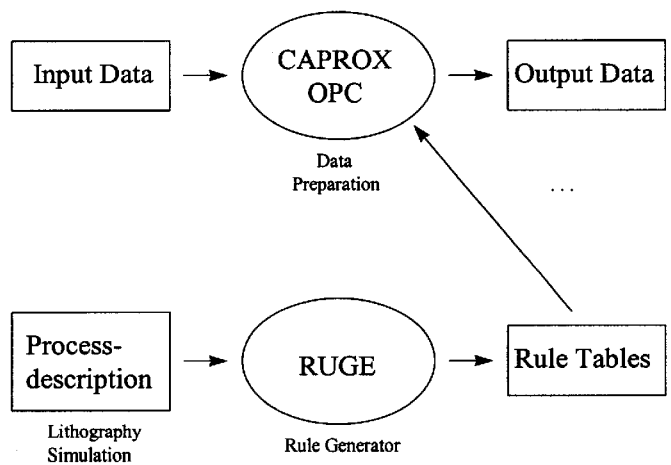
FIG. 1 is a flow diagram showing CAPROX (RTM) and RUGE (RTM)

Referring to FIG. 1, it will be seen that the OPC program uses rules which are generated by RUGE (RTM) using the results of a lithography simulation which simulates the behaviour of the photoresist.

Figure 2:
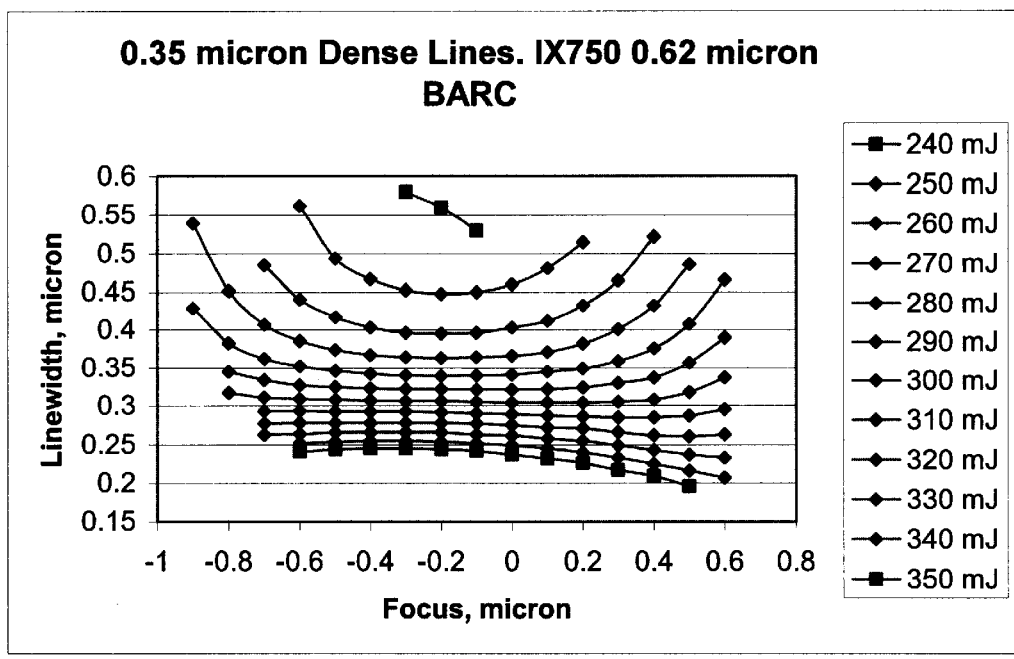
FIG. 2 shows a set of graphs, collectively referred to as a focus/exposure matrix, wherein each graph shows the variation of linewidth with focus at a different exposure, for dense lines.

Referring now to FIG. 2, optical lithography processes can be described by "focus/exposure matrices", referred to here as F/E matrices. The matrix is formed from a number of graphs at different exposures, each plotting linewidth against lens focus position. A family of such curves at different exposures forms the matrix. The exposure has units mJ, and is dependent on both exposure time and intensity. The focus position has units of microns, and represents the distance between the lens (used to direct light onto the resist) and the surface of the wafer itself. In practice the wafer is moved towards or away from the lens, which remains stationary because of its usually large size.

The focus scale is arbitrary in its setting as zero focus can be variously described, but here is defined by the focus setting at the mid point of the usable, or flattest, section of one of the exposure contours. Similarly, the sign of the focus scale is arbitrary, but in FIG. 2 an increasing positive value represents moving the wafer away from the lens, so that the focus lies above the wafer, and an increasing negative value represents moving the wafer towards the lens, so that the focus lies within the substrate or resist.

It should be appreciated that if the wafer has been previously etched, the surface of the wafer varies in height, and as a result it is desirable for the process to have as little dependence on focus position as possible.

The 0.35 micron linewidth referred to in FIG. 2 is the drawn size on the reticle and is thus subject to over and underexposure as exposures vary. A lithography process is optimised by having the exposure contours as close as possible (good exposure latitude, that is little variation with varying exposure) and each exposure contour as flat as possible (ie. good depth-of-focus).

A typical F/E matrix is shown in FIG. 2 where the reticle feature is 0.35 micron dense lines (equal line and space, that is each line has a width of 0.35 microns, and is spaced from the next by 0.35 microns, so that the pitch is 0.7 microns). In FIG. 2, IX750 refers to the photoresist type used and BARC refers to the fact that the photoresist has an underlying anti-reflective coating.

Figure 3:
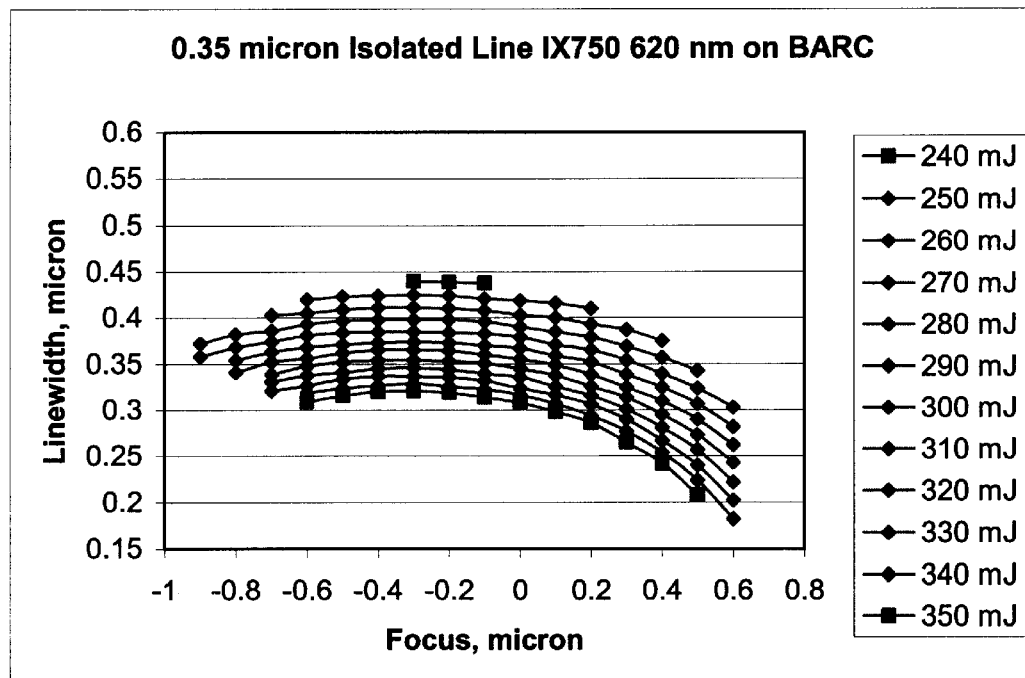
FIG. 3 shows a focus/exposure matrix for isolated lines.

FIG. 3 shows on the same scale the corresponding F/E matrix for an isolated line. It is clear that the matrix shapes in FIGS. 2 and 3 are different in a number of ways. In particular, similar exposures on each graph result in a different linewidth, thus producing a dense-isolated offset, whilst dense and isolated features have different depth-of-focus, as judged by the flatness of exposure contours. The dense-isolated offset has units nm, and represents the difference in linewidth for a given exposure and given focus at two different pitches, specifically in this instance dense (1:1) and isolated (1:4).

Figure 4:
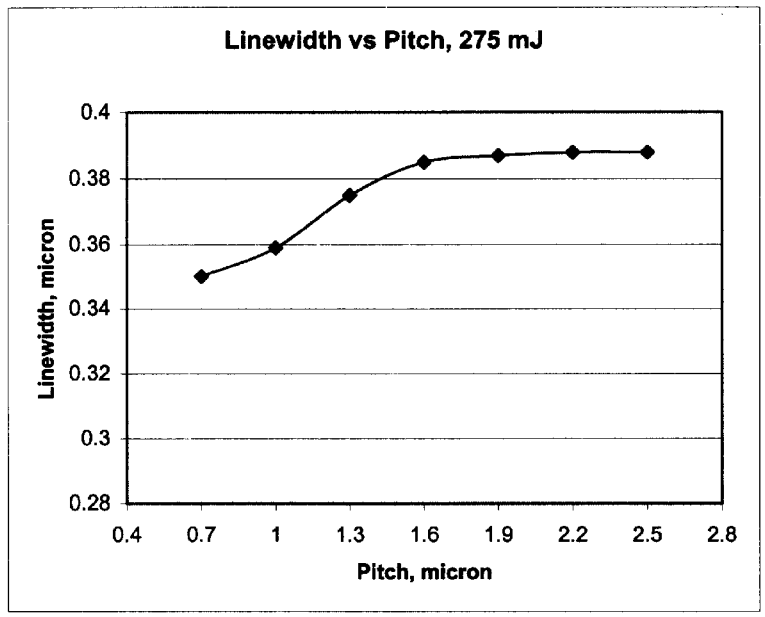
FIG. 4 shows the variation of linewidth with pitch at an exposure of 275 mJ.

Moving to FIG. 4, when rules are generated from lithography simulation, and input to RUGE, as shown in FIG. 1, they are generated from a linewidth versus pitch function. The difference between the linewidths at the limits of this function, corresponding to dense and isolated lines, define the dense-isolated offset mentioned above.

FIG. 4 shows a linewidth versus pitch function where a 0.35 micron dense line/space is exposed to size at 275 mJ. That is, a reticle is used which has apertures which produce lines on the resist which are 0.35 microns wide and which are spaced by 0.7 microns, when exposed using an exposure of 275 mJ. This corresponds to the first point on the graph of FIG. 4. Exposure to size means using an exposure such that the reticle and wafer (substrate) linewidths are equal, after normalising the reticle linewidth to take into account the lens magnification factor. For example for a 5× reduction lens the actual reticle sizes are 5 times those on the wafer when exposed to size. In this case, what is referred to in the industry as a 0.35 micron linewidth on the reticle is in reality 1.75 microns. The graph of FIG. 4 describes how the linewidth of the 0.35 micron line, drawn at the same size at each pitch on the reticle, varies when printed on the wafer at different pitches between dense and isolated conditions. A 1:4 line:space ratio can be considered isolated. The first point on the graph of FIG. 4 corresponds to a line:space ratio of 1:1, and the last point on the graph corresponds to a line:space ratio of about 1:5. The graph of FIG. 4 thus spans from dense to isolated lines.

FIG. 4 simply assumes that the exposure used to generate the linewidth vs pitch function is that for exposing dense lines to size. That is, the lines are correctly sized to a width of 0.35 microns when the pitch is 0.7 microns, ie. when the lines are dense. However, as the pitch increases, it can be seen from FIG. 4 that the linewidth also increases, and the change in linewidth between the dense and isolated conditions is referred to as the dense-isolated offset.

Figure 5:
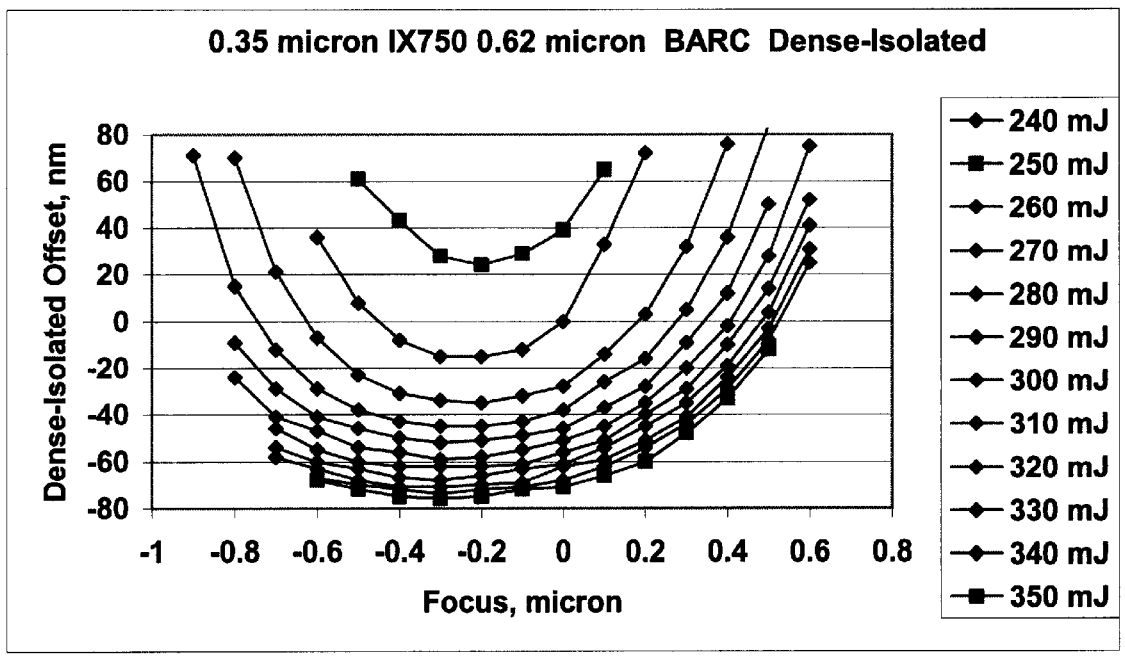
FIG. 5 shows a set of graphs, collectively referred to herein as a dense-isolated offset focus/exposure matrix, which is generated by subtracting each value in FIG. 2 from the corresponding value in FIG. 3.

FIG. 5 is produced by subtracting each value in FIG. 3 from the corresponding value in FIG. 2. Each point in FIG. 5 thus represents the difference in linewidth (ie the offset) between the dense and isolated conditions, at a given focus and exposure. FIG. 5 thus shows the dense-isolated offset plotted against focus for each different exposure. The set of contours shown in FIG. 5 are collectively referred to herein as a dense-isolated offset focus/exposure matrix, or F/E matrix. The applicant has found that the dense-isolated offset F/E matrix of FIG. 5 can be used to improve process margins in OPC.

In any lithographic process, the magnitude of the dense-isolated offset is determined by a number of parameters including lens numerical aperture and resist contrast, but the principle described can be used in any process. The figures given here describe one example of a process which has been carried out by the applicant and are thus a worked example. The graphs shown are formed from data produced by lithography simulation but practical curves, in agreement with the modelled data, have also been produced.

FIG. 4 is the curve which describes the process for inputs to RUGE (RTM) which then creates rules for input to CAPROX (RTM). This OPC is made on the basis that the chosen exposure is that for referring all pitches to dense lines which are printed on size. However, FIG. 5 shows that the exposure of 275 mJ produces a contour on the dense-isolated offset F/E matrix which has considerable curvature and that, in this particular example, a higher exposure would give a flatter and thus more desirable dense-isolated offset contour and an increased magnitude of (in this case negative) dense-isolated offset. The fact that the dense-isolated offset increases does not matter in OPC as it can be corrected by a different linewidth versus pitch function. For instance, increasing the exposure to 315 mJ, at zero focus, causes the dense-isolated offset to increase to about 60 nm, but the contour is considerably flatter than at an exposure of 275 mJ. A flatter contour indicates that the offset is less affected by variation of the distance between the lens and the wafer. As mentioned above, after various stages of etching have been carried out, the surface of the wafer is no longer flat and as a result it is important that during any further stages of lithography the process is not greatly affected by variations in the focus position. Depth-of-focus of lenses in such applications is typically of the same order as the surface topography of the wafer so any improvement is a gain in manufacturing control.

Figure 6:
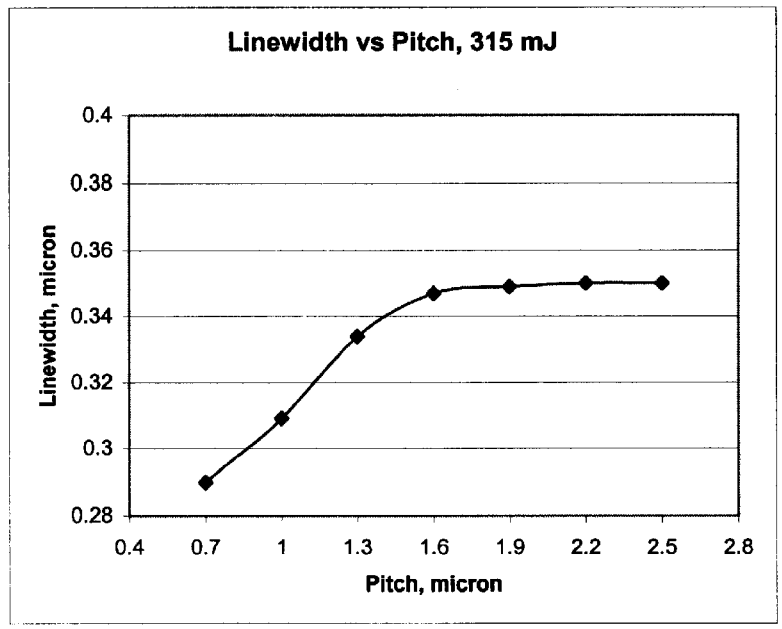
FIG. 6 shows the variation of linewidth with pitch at an exposure of 315 mJ.

FIG. 6 is produced on the same scale as FIG. 4, and shows the new function of linewidth versus pitch, at an exposure of 315 mJ, which must be input to RUGE (RTM), so that RUGE (RTM) can generate the appropriate rules for use during OPC.

What is claimed is:

1. A method of carrying out optical proximity correction in the design of a reticle for exposing a photoresist on a substrate in photolithography using a lens having a focal plane, the method including the steps of:

generating a dense-isolated offset focus/exposure matrix, containing dense-isolated offset values, being the difference between values for the linewidth of dense and isolated lines printed on said substrate, as a function of focal plane position, for each of a plurality of different exposures;

selecting from among the contours of the dense-isolated offset focus/exposure matrix for each different exposure, the flattest contour, being the contour which is flattest in terms of variation of the dense-isolated offset over the range of focal plane positions of interest; and carrying out optical proximity correction on the basis that the exposure will be a selected exposure corresponding to said flattest contour.

2. A method as claimed in claim 1, which further includes, prior to said generating step, the steps of:

obtaining a first focus/exposure matrix, containing values for the linewidth of dense lines printed on said substrate as a function of focal plane position at said plurality of different exposures;

obtaining a second focus/exposure matrix, containing values for the linewidth of isolated lines printed on said substrate as a function of focal plane position at said plurality of different exposures.

3. A method as claimed in claim 1, wherein said dense lines have a line to space ratio of about 1 to 1.

4. A method as claimed in claim 1, wherein said isolated lines have a line to space ratio of about 1 to 4.

5. A method as claimed in claim 1, wherein an optical proximity correction program is used which makes use of rules generated by a rule generation program.

6. A method as claimed in claim 1, wherein a lithography simulation program is used to simulate the behaviour of the photoresist at said selected exposure.

7. A method as claimed in claim 5, wherein the results of said lithography simulation program are used by said rule generation program.

8. A method as claimed in claim 1, wherein said obtaining steps are carried out by computer simulation.

9. A method as claimed in claim 1, wherein said selecting step is carried out by a person.

10. A reticle produced by the method of claim 1.

* * * * *